(12) United States Patent
Devins et al.

(10) Patent No.: US 7,917,348 B2
(45) Date of Patent: *Mar. 29, 2011

(54) METHOD OF SWITCHING EXTERNAL MODELS IN AN AUTOMATED SYSTEM-ON-CHIP INTEGRATED CIRCUIT DESIGN VERIFICATION SYSTEM

(75) Inventors: Robert J. Devins, Essex Junction, VT (US); Robert D. Herzl, South Burlington, VT (US); David W. Milton, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 415 days.

This patent is subject to a terminal disclaimer.

(21) Appl. No.: 11/969,991

(22) Filed: Jan. 7, 2008

(65) Prior Publication Data

US 2008/0133206 A1 Jun. 5, 2008

Related U.S. Application Data

(63) Continuation of application No. 09/683,677, filed on Feb. 1, 2002, now Pat. No. 7,353,156.

(51) Int. Cl.
*G06F 17/50* (2006.01)
(52) U.S. Cl. ............................................. 703/14; 716/18
(58) Field of Classification Search ................... 703/15, 703/14; 716/18
See application file for complete search history.

(56) References Cited

U.S. PATENT DOCUMENTS

| 5,600,579 | A | * | 2/1997 | Steinmetz, Jr. | 703/13 |
| 5,841,967 | A | * | 11/1998 | Sample et al. | 714/33 |
| 5,881,267 | A | * | 3/1999 | Dearth et al. | 703/27 |
| 6,279,146 | B1 | * | 8/2001 | Evans et al. | 716/18 |
| 6,678,645 | B1 | * | 1/2004 | Rajsuman et al. | 703/20 |

OTHER PUBLICATIONS

Santanu Dutta, "Viper; A multiprocessor SOC for Advanced set-top box and digital tv systems", Oct. 2001.*
B. Blaner, "An Embedded PowerPC SOC for Test and Measurement Applications", IEEE 2000.*
B. Blaner, D. Czenkusch, R. Devins, and S. Stever, "An Embedded PowerPC TM SOC for Test and Measurement Applications", IEEE 2000.*
Blaner et al.; An Embedded PowerPC™ SOC for Test and Measurement Applications; 2000 IEEE; pp. 204-208.
Dutta et al.; "Viper: A Multiprocessor SOC for Advanced Set-Top Box and Digital TV Systems"; Sep.-Oct. 2001; IEEE; pp. 21-31.

* cited by examiner

*Primary Examiner* — Kamini S Shah
*Assistant Examiner* — Angel J Calle
(74) *Attorney, Agent, or Firm* — Schmeiser, Olsen & Watts; Richard M. Kotulak

(57) ABSTRACT

A system and method for verifying an integrated circuit design is provided. The system comprising: an I/O controller connected to one or more I/O cores, the I/O cores part of the integrated circuit design; an external memory mapped test device having a switch for selectively connecting one or more of the I/O cores to corresponding I/O driver models; a bus for transferring signals between the I/O controller and the switch; and a test operating system for controlling the switch.

13 Claims, 7 Drawing Sheets

METHOD OF SWITCHING EXTERNAL MODELS IN AN AUTOMATED SYSTEM-ON-CHIP INTEGRATED CIRCUIT DESIGN VERIFICATION SYSTEM

This application is a continuation of and claims priority of copending U.S. patent application Ser. No. 09/683,677 filed on Feb. 1, 2002.

FIELD OF THE INVENTION

The present invention relates to the field of testing computer system designs by software simulation; more specifically, it relates to method and an automated system for system-on-chip (SOC) design verification.

CROSS REFERENCE TO RELATED APPLICATIONS

This application is related by common inventorship and subject matter to co-pending applications titled "Method of Controlling External Models in System-On-Chip Verification" Ser. No. 09/494,230, "Simulator-Independent System-On-Chip Verification Methodology" Ser. No. 09/494,565, "A Method of Developing Re-Usable Software for Efficient Verification of System-On-Chip Integrated Circuit Designs" Ser. No. 09/494,907, "Method for Efficient Verification of System-On-Chip Integrated Circuit Designs Including an Embedded Processor" Ser. No. 09/494,564, "Processor-Independent System-On-Chip Verification for Embedded Processor Systems" Ser. No. 09/494, 386, "Method for Re-Using System-On-Chip Verification Software in an Operating System" Ser. No. 09/495,236 and "Automated System-On-Chip Integrated Circuit Design Verification System" Ser. No. 09/969,675. The listed applications are assigned to International Business Machines Corporation and are entirely incorporated herein by this reference.

BACKGROUND OF THE INVENTION

The complexity and sophistication of present-day integrated circuit (IC) chips have advanced significantly over those of early chip designs. Where formerly a chip might embody relatively simple electronic logic blocks affected by interconnections between logic gates, currently chips can include combinations of complex, modularized IC designs often called "cores" which together constitute an entire SOC.

In general, IC chip development includes a design phase and a verification phase for determining whether a design works as expected. The verification phase has moved increasingly toward a software simulation approach to avoid the costs of first implementing designs in hardware to verify them A key factor for developers and marketers of IC chips in being competitive in business is time-to-market of new products, the shorter the time-to-market, the better the prospects for sales. Time-to-market in turn depends to a significant extent on the duration of the verification phase for new products to be released. As chip designs have become more complex, shortcomings in existing chip verification methodologies, which extend time-to-market have become evident.

Typically, in verifying a design, a simulator is used. Here, "simulator" refers to specialized software whose functions include accepting software written in a hardware description language (HDL) such as Verilog or VHDL which models a circuit design (for example, a core as described above), and using the model to simulate the response of the design to stimuli which are applied by a test case to determine whether the design functions as expected. The results are observed and used to de-bug the design.

In order to achieve acceptably bug-free designs, verification software must be developed for applying a number of test cases sufficient to fully exercise the design in simulation. In the case of SOC designs, the functioning of both the individual cores as they are developed, and of the cores functioning concurrently when interconnected, as a system must be verified. Moreover, a complete SOC design usually includes an embedded processor core and an I/O controller. Simulation, which includes a processor core, tends to require an inordinate amount of time and computing resources, largely because the processor is usually the most complex piece of circuitry on the chip and interacts with many other cores. Simulation, which includes an I/O controller, tends to require an inordinate amount of new software or software modification because the specific I/O cores, pin connections, number of pins, etc. vary from design to design.

It can be appreciated from the foregoing that verification of an SOC can severely impact time-to-market, due to the necessity of developing and executing software for performing the numerous test cases required to fully exercise the design.

However, inefficiencies in current verification methodologies exacerbate time pressures. For example, design specific verification software must be written or the existing software modified for each specific chip design to be verified. With today=s exceedingly complex SOC designs, even modification of existing software is expensive and time consuming. One particularly time-consuming need is to write or modify the software needed for verifying I/O pin muxing of SOC cores to I/O pin driver models. Simulation of pin muxing presents unique challenges because some I/O pin driver models cannot be turned off and there is no standard established for turning on/off those models that can be turned on/off.

A design verification system is needed which will reduce the amount of chip specific design verification software required, especially for verification of pin-muxing, as well as reduce the time to collect and integrate that software.

SUMMARY OF THE INVENTION

A first aspect of the present invention is a system for verifying an integrated circuit design comprising: an I/O controller connected to one or more I/O cores, the I/O cores part of the integrated circuit design; an external memory mapped test device having a switch for selectively connecting one or more of the I/O cores to corresponding I/O driver models; a bus for transferring signals between the I/O controller and the switch; and a test operating system for controlling the switch.

A second aspect of the present invention is a method for verifying an integrated circuit design comprising: providing an I/O controller connected to one or more I/O cores, the I/O cores part of the integrated circuit design; providing an external memory mapped test device having a switch for selectively connecting one or more of the I/O cores corresponding I/O driver models; providing a bus for transferring signals between the I/O controller and the switch; providing a test operating system for controlling the switch; and simulating the integrated circuit design by running a test case on the test operating system.

A third aspect of the present invention is a program storage device readable by machine, tangibly embodying a program of instructions executable by the machine to perform method steps for verifying an integrated circuit design, the method steps comprising: providing an I/O controller connected to one or more I/O cores, the I/O cores part of the integrated circuit design; providing an external memory mapped test device having a switch for selectively connecting one or more of the I/O cores to corresponding I/O driver models; providing a bus for transferring signals between the I/O controller and the switch; providing a test operating system for controlling the switch; and simulating the integrated circuit design by running a test case on the test operating system.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

The term "core" as used herein refers to a module of logic for an integrated circuit chip design of any degree of complexity, which may be used as a component of a SOC. The term "model" as used herein refers to a module of software representing an external I/O driver connected to I/O pins used in conjunction with the testing of a corresponding "core." For the purposes of the present invention, SOC and chip are equivalent terms. In its developmental stages, a core or model is typically embodied as a simulatable HDL program written at some level of abstraction, or in a mixture of abstraction levels, which can describe the function of the core prior to its actual physical implementation in silicon. Major levels of abstraction that are generally recognized include a behavioral level, a structural level and a logic gate level. A core or model may be in the form of a netlist including behavioral, structural and logic gate elements. Ultimately, after verification, design logic represented by a core or model is physically implemented in hardware.

Figure 1:
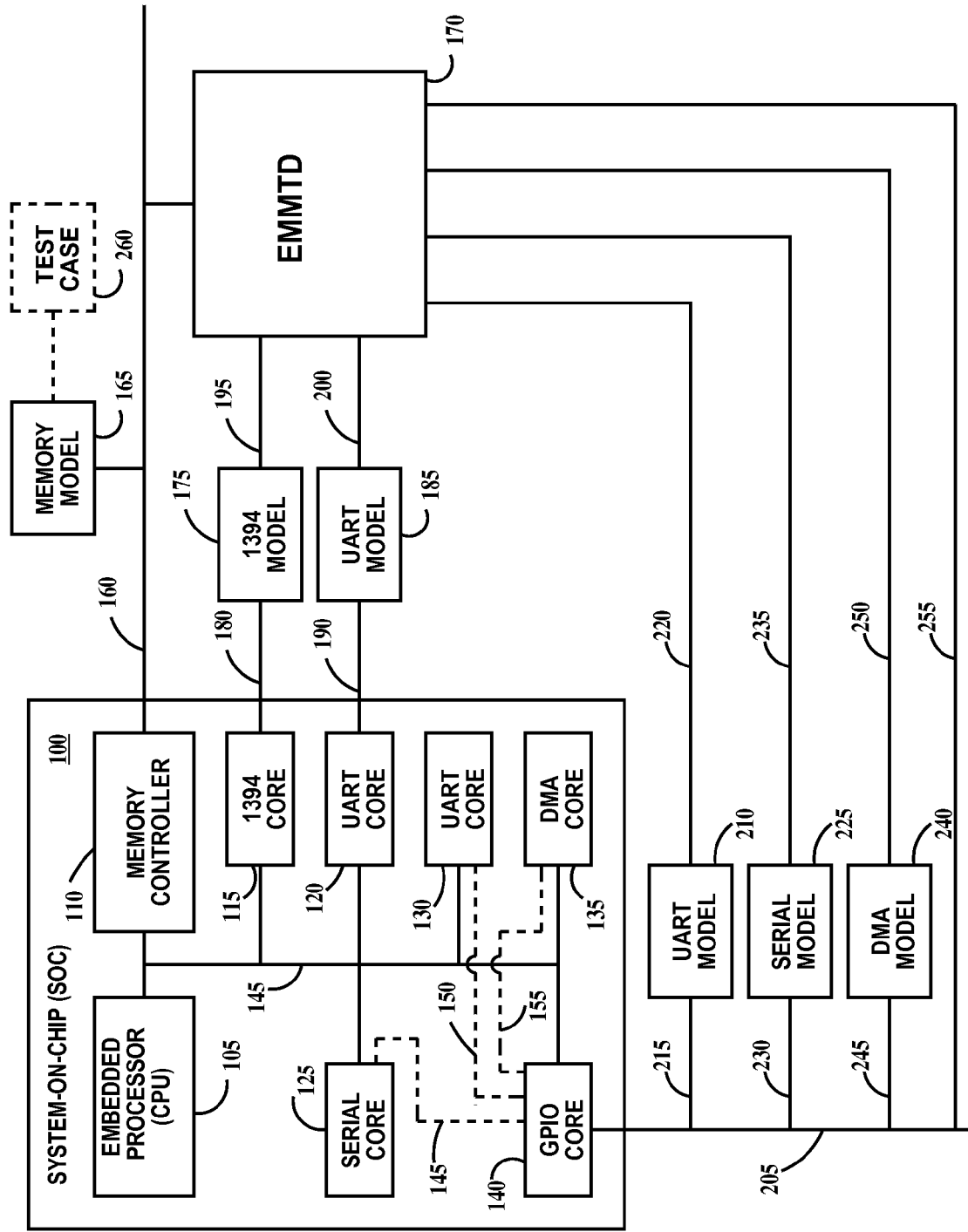
FIG. 1 illustrates an exemplary SOC that includes dedicated and muxed cores connected to external dedicated and muxed driver models and communicated with/controlled by an external memory mapped test device (EMMTD) in response to a test case.

FIG. 1 illustrates an exemplary SOC that includes dedicated and muxed cores connected to external dedicated and muxed driver models and communicated with/controlled by an external memory mapped test device (EMMTD) in response to a test case. In FIG. 1, SOC 100 includes an embedded processor core 105, a memory controller core 110, a dedicated 1394 core 115, adedicated universal asynchronous receiver transmitter (UART) core 120, a muxed serial core 125, a muxed UART core 130, a muxed direct memory access (DMA) core 135 and a general purpose I/O core (GPIO) 140 (which is an I/O controller) all coupled to a system bus 145. Additionally, muxed serial core 125 is connected to directly to GPIO core 140 by bus 145, muxed UART core 130 is connected to directly to GPIO core 140 by a bus 150 and muxed DMA core 135 is connected directly to GPIO core 140 by a bus 155.

Memory controller core 110 is coupled via a memory bus 160 to an external memory model 165. An EMMTD 170 is also coupled to memory bus 160.

Dedicated 1394 core 115 is coupled to a dedicated 1394 model 175 via a bus 180. Dedicated UART core 120 is coupled to a dedicated UART model 185 by a bus 190. Dedicated 1394 model 175 is coupled to EMMTD 170 by a bus 195. Dedicated UART model 185 is coupled to EMMTD 170 by a bus 200.

GPIO 140 is coupled to a GPIO bus 205. A muxed UART model 210 is coupled to GPIO bus 205 by a bus 215 and coupled to EMMTD 170 by a bus 220. A muxed serial model 225 is coupled to GPIO bus 205 by a bus 230 and coupled to EMMTD 170 by a bus 235. A muxed DMA model 240 is coupled to GPIO bus 205 by a bus 245 and coupled to EMMTD 170 by a bus 250. GPIO bus 205 is also coupled to EMMTD 170 by a bus 255 to allow direct read/write access to I/O pins.

For the purposes of the present invention, SOC 100 is intended to include embodiments in any known form of logic design, including simulatable HDL modules and netlists. In one example, embedded processor core 105, memory controller core 110, dedicated 1394 core 115, dedicated UART core 120, muxed serial core 125, muxed UART core 130, muxed DMA core 135, GPIO core 140, external memory model 165, EMMTD 170, dedicated 1394 model 175, dedicated UART model 185, muxed UART model 210, muxed serial model 225 and muxed DMA model 240 are HDL modules being simulated by a test operating system (TOS) and memory bus 160, GPIO bus 205 and buses 145, 150, 155, 180, 190, 215, 220, 230, 235, 245, 250 and 255 represent virtual connections implemented by code specifications.

The aforementioned TOS is also known as an automated test operating system or AutoTOS.

Dedicated 1394 model 175, dedicated UART model 185, muxed UART model 210, muxed serial model 225 and muxed DMA model 240 are external to SOC 100 and are the I/O pin driver simulation models needed to test the SOC.

Also shown in FIG. 1 is a test case 260, representing computer-executable instructions loaded into external memory model 165 and executed by embedded processor core 105 to perform verification of SOC 100. Test case 260 is a set of computer-executable instructions, which generate stimuli to verify the design of SOC 100. The application of the test case typically produces, as output, result data representing the response of the simulated design, which is compared to expected results, to determine whether the design functions as expected. The design may subsequently be revised to improve performance or de-bug errors.

Figure 2:
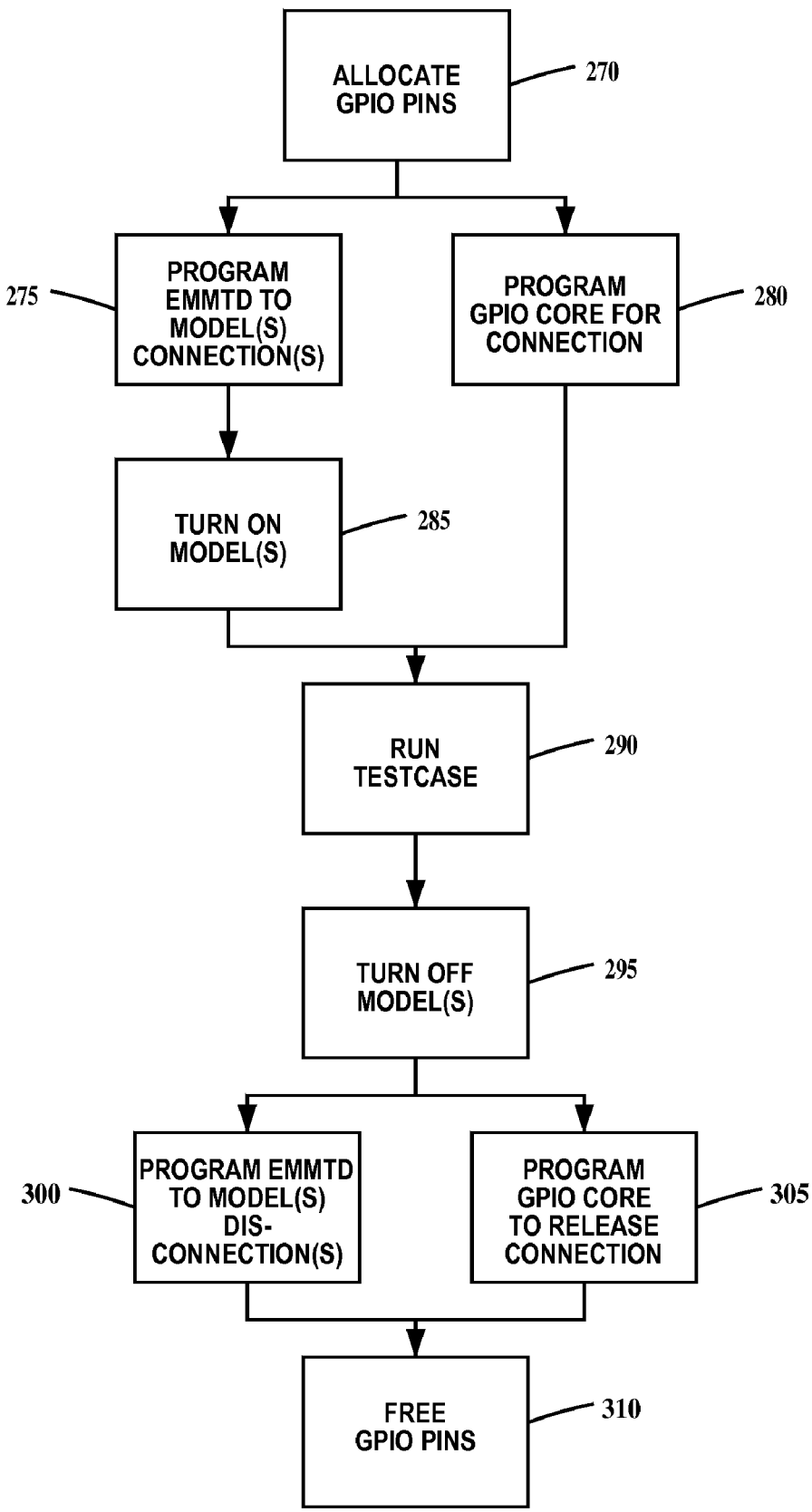
FIG. 2 is a flowchart illustrating the method of switching the external muxed driver models illustrated in FIG. 1.

GPIO core 140 can switch one of buses 145, 150 and 155 to GPIO bus 205 based upon how the GPIO core is programmed. If for example, bus 150 is muxed, then muxed UART core 130 is connected to muxed UART model 210 and muxed UART model 210 is corrected to EMMTD 170. Muxed UART model 210, muxed serial model 225 and muxed DMA model 240 are tri-state driver models. Tri-stating drivers allow one model (or more depending upon how the I/O pins are allocated) to take control of GPIO bus 205 while the other models are tri-stated. The method of switching models is illustrated in FIG. 2 and described below. By contrast, dedicated 1394 core 115 and dedicated UART core 120 are always connected to EMMTD 170 through dedicated 1394 model 175 and dedicated UART model 185, respectively.

Embedded processor 105 starts/stops dedicated 1394 model 175 and dedicated UART model 185 via system bus 145, memory controller 110, memory bus 160, EMMTD 170 and buses 195 and 200 respectively. Embedded processor 105 starts/stops muxed UART model 210, muxed serial model 225 and muxed DMA model 240 via system bus 145, memory controller 110, memory bus 160, EMMTD 170 and buses 220, 235 and 250 respectively. Dedicated UART model 185 and muxed UART model 210 are not required to be identical.

While two dedicated cores and their corresponding dedicated models (dedicated 1394 core 115 and dedicated 1394 model 175 and dedicated UART core 120 and dedicated UART model 185) are illustrated in FIG. 1, more or less and different combinations of dedicated cores and dedicated models may be employed. Also, while three muxed cores and their corresponding muxed models (muxed serial core 125 and muxed serial model 225, muxed UART core 130 and muxed UART model 210 and muxed DMA core 135 and muxed DMA model 240) are illustrated in FIG. 1, more or less and different combinations of muxed cores and muxed models may be employed.

FIG. 2 is a flowchart illustrating the method of switching the external muxed driver models illustrated in FIG. 1. In step 270, the TOS is programmed to allocate the required GPIO pins in order for multiple tests to be run concurrently. For example, if GPIO core 140 (see FIG. 1) has 15 pins, then a muxed core requiring 7 pins and a muxed core requiring up to 8 pins can be run together. Obviously, some muxed cores may require so many pins that they must be run alone.

In step 275, the connection between EMMTD 170 (see FIG. 1) and the muxed models for which pins have been allocated in step 270 is programmed. The code for this programming step is generally unique to each of the models.

In step 280, GPIO core 140 (see FIG. 1) is programmed to connect the GPIO to the muxed cores for which pins have been allocated in step 270. The code for this programming step is generally unique to each of the cores for which pins have been allocated.

In step 285, the corresponding models for the cores for which pins have been allocated in step 270 are programmed to turn on. If these models are not tri-state driver models then code must be modified to make the models tri-state driver models.

In step 290, test case 260 (see FIG. 1) is programmed to run.

In step 295, the corresponding models for the cores for which pins have been allocated in step 270 are programmed to turn off.

In step 300, the disconnection of EMMTD 170 (see FIG. 1) from the muxed cores for which pins have been allocated in step 270 is programmed.

In step 305, GPIO core 140 (see FIG. 1) is programmed to disconnect the GPIO from the muxed cores for which pins have been allocated in step 270.

In step 310, the TOS is programmed to free the GPIO pins allocated in step 270.

Figure 3:
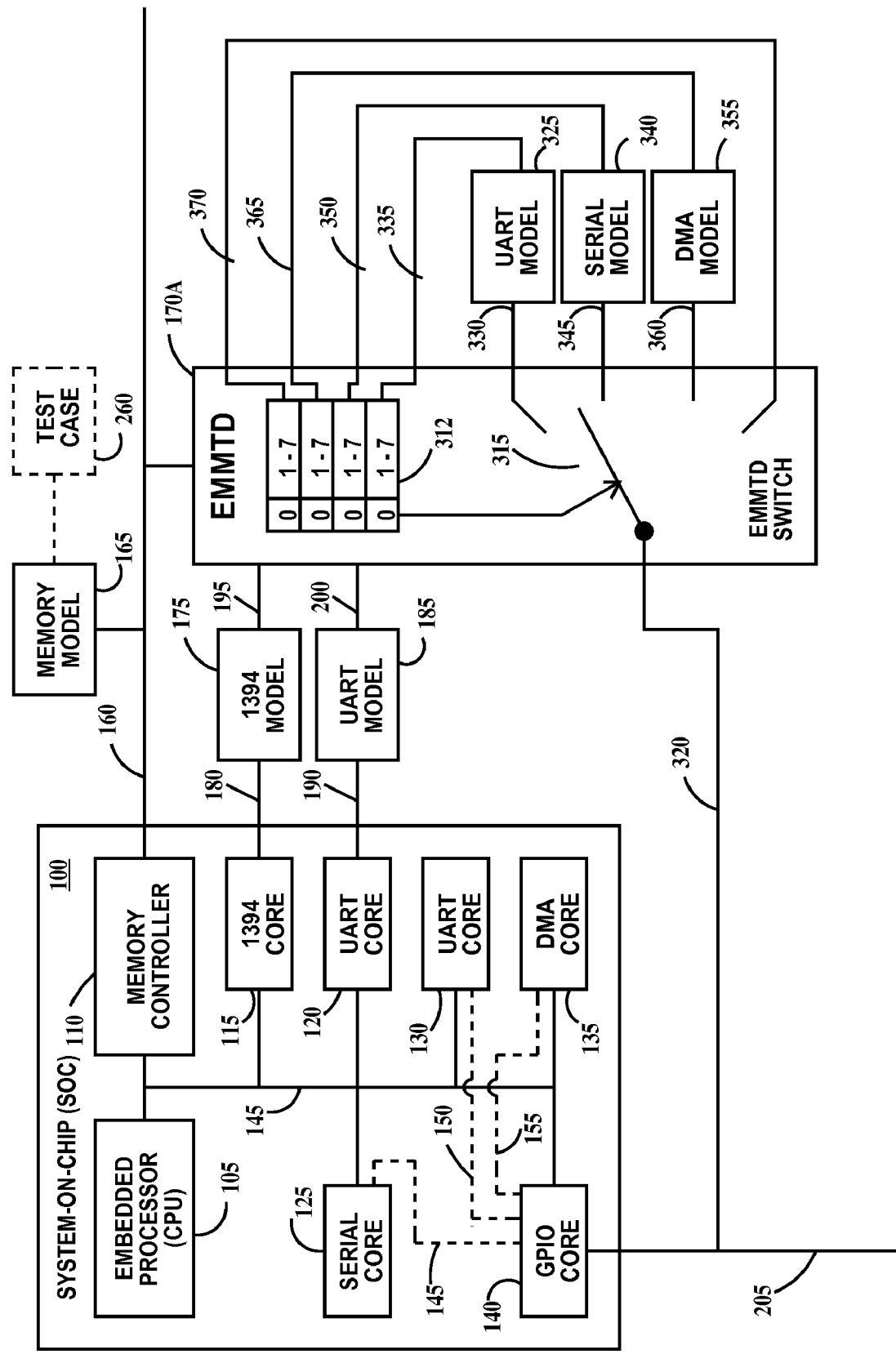
FIG. 3 illustrates an exemplary SOC that includes dedicated and muxed cores connected to external dedicated and muxed driver models and communicated with/controlled by an EMMTD in response to a test case according to a first embodiment of the present invention.

FIG. 3 illustrates an exemplary SOC that includes dedicated and muxed cores connected to external dedicated and muxed driver models and communicated with/controlled by an EMMTD in response to a test case according to a first embodiment of the present invention. The present invention essentially modifies EMMTD 170 (see FIG. 1) as well as external muxed I/O models and the connections between them. In FIG. 3, SOC 100 includes embedded processor core 105, memory controller core 110, dedicated 1394 core 115, dedicated universal asynchronous receiver transmitter (UART) core 120, muxed serial core 125, muxed UART core 130, muxed dynamic memory allocation (DMA) core 135 and general purpose I/O core (GPIO) 140 (which is an I/O controller) all coupled to system bus 145. Additionally, muxed serial core 125 is connected to directly to GPIO core 140 by bus 145, muxed UART core 130 is connected to directly to GPIO core 140 by bus 150 and muxed DMA core 135 is connected directly to GPIO core 140 by bus 155.

Memory controller core 110 is coupled via memory bus 160 to an external memory model 165. An EMMTD 170A is also coupled to memory bus 160. EMMTD 170A includes an address register 312 and an EMMTD switch 315.

Dedicated 1394 core 115 is coupled to dedicated 1394 model 175 via bus 180. Dedicated UART core 120 is coupled to a dedicated UART model 185 by bus 190. Dedicated 1394 model 175 is coupled to EMMTD 170A by bus 195. Dedicated UART model 185 is coupled to EMMTD 170A by bus 200.

GPIO 140 is coupled to GPIO bus 205. GPIO bus 205 is coupled to EMMTD switch 315 by a bus 320. A muxed UART model 325 is coupled to EMMTD switch 315 by a bus 330 and coupled to address register 312 by a bus 335. A muxed serial model 340 is coupled to EMMTD switch 315 by a bus 345 and coupled to address register 312 by a bus 350. A muxed DMA model 355 is coupled to EMMTD switch 315 by a bus 360 and coupled to address register 312 by a bus 365. EMMTD switch 315 is also coupled to address register 312 by a bus 370 to allow direct read/write access to I/O pins. Bus 370 may be considered as connected to an I/O model defining only direct pin connections.

For the purposes of the present invention, EMMTD 170A (including address register 312 and switch 315), muxed UART model 325, muxed serial model 340 and muxed DMA model 355 are HDL modules being simulated by the TOS and buses 320, 330, 335, 345, 350, 360, 365 and 370 represent virtual connections implemented by code specifications.

Dedicated 1394 model 175, dedicated UART model 185, muxed UART model 325, muxed serial model 340 and muxed DMA model 355 are external to SOC 100 and are the I/O driver simulation models needed to test the SOC.

Also shown in FIG. 3 is test case 260, representing computer-executable instructions loaded into external memory model 165 and executed by embedded processor core 105 to perform verification of SOC 100.

GPIO core 140 can selectively switch buses 145, 150 and 155 to GPIO bus 205 based upon how the GPIO core is programmed. If for example, bus 150 is muxed, then muxed UART core 130 is connected via GPIO bus 205 and bus 320 to EMMTD switch 315. EMMTD switch 315 is also programmed to selectively connect bus 320 to bus 330 allowing muxed UART model 325 to be connected to EMMTD 170A and address register 312. EMMTD switch 315 allows one model to take control of GPIO bus 205. EMMTD switch 315 is a controlled by the TOS and eliminates the need for tri-state control. Though EMMTD switch 315 is illustrated in FIG. 3 as a single throw switch switching only one driver model at a time, as the EMMTD switch is simply a set of logic gates, the EMMTD switch may selectively connect more than one of the driver models to bus 320 upon I/O pin allocation.

Embedded processor 105 starts/stops dedicated 1394 model 175 and dedicated UART model 185 via system bus 145, memory controller 110, memory bus 160, EMMTD 170A, and buses 195 and 200 respectively. Embedded processor 105 starts/stops muxed UART model 325, muxed serial model 340 and muxed DMA model 355 via system bus 145, memory controller 110, memory bus 160, EMMTD 170A and buses 335, 350 and 365 respectively. Dedicated UART model 185 and muxed UART model 325 may be identical. In fact, all driver models having the same function and pin counts may be identical whether or not they are "dedicated" or "muxed."

The TOS uses a systems definition file (SDF) to specify which cores use GPIO bus 205 and what bits of the GPIO bus are being used. With this information TOS code can be automatically generated to allocate GPIO bits, program GPIO core 140 and set EMMTD switch to the correct model and release the GPIO pins. Automatic generation of TOS code may be performed by an AUTO-TOS as described in the cross-referenced applications. The method of switching models is illustrated in FIG. 4 and described below.

While two dedicated cores and their corresponding dedicated models (dedicated 1394 core 115 and dedicated 1394 model 175 and dedicated UART core 120 and dedicated UART model 185) are illustrated in FIG. 3, more or less and different combinations of dedicated cores and dedicated models may be employed. Also, while three muxed cores and their corresponding muxed models (muxed serial core 125 and muxed serial model 340, muxed UART core 130 and muxed UART model 325 and muxed DMA core 135 and muxed DMA model 355) are illustrated in FIG. 3, more or less and different combinations of muxed cores and muxed models may be employed.

Figure 4:
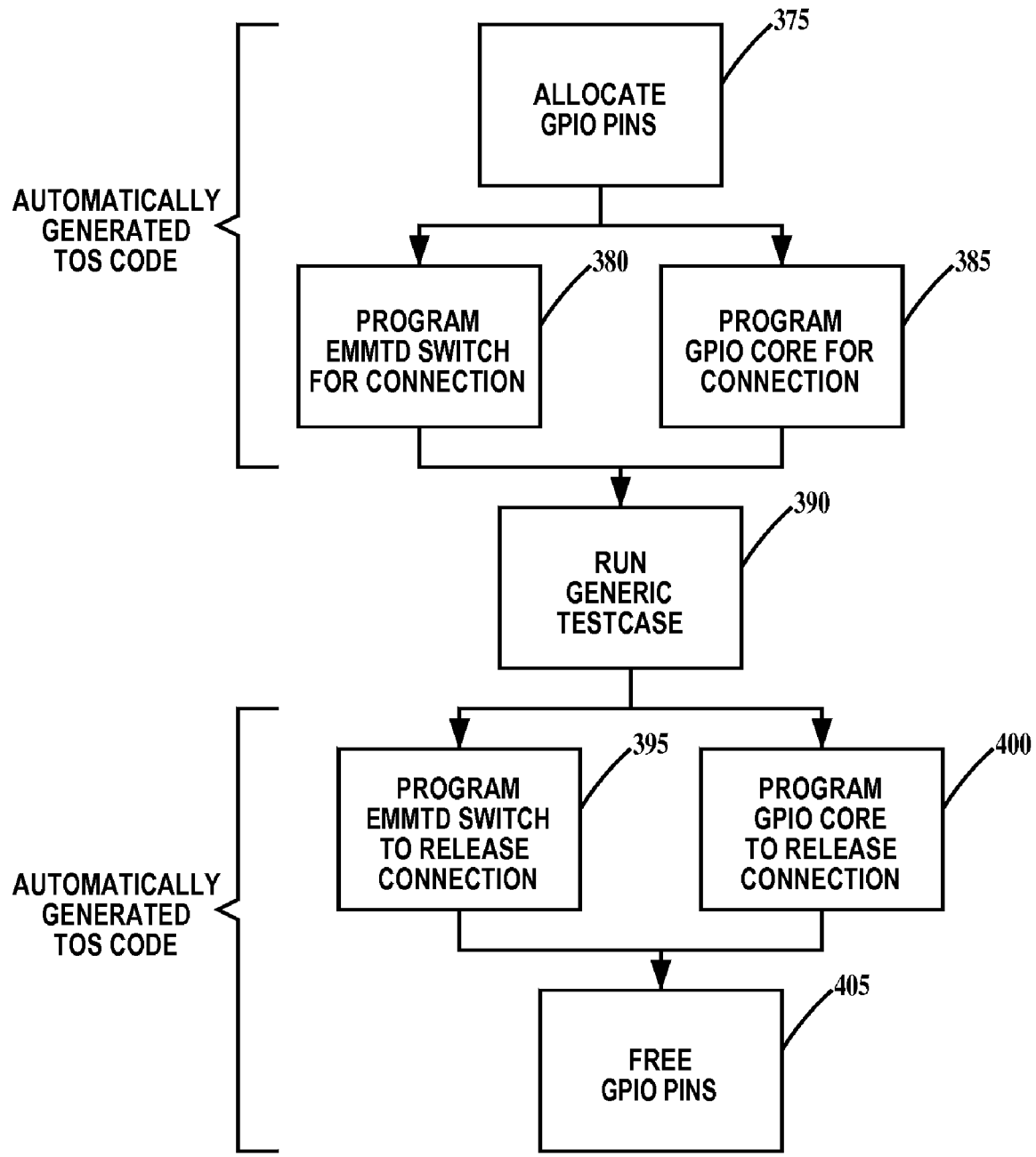
FIG. 4 is a flowchart illustrating the method of switching the external muxed driver models illustrated in FIG. 3 according to the present invention.

FIG. 4 is a flowchart illustrating the method of switching the external muxed driver models illustrated in FIG. 3 according to the present invention. EMMTD switch 315 (see FIG. 3) allows a general test case to be used for all multiplexed cores. To reuse the general test case the proper conditions must be setup prior to starting the test so that the connection is ready and dedicated to the test. Because signals are multiplexed both inside and outside SOC 100 (see FIG. 3), programming must be performed to establish this connection.

In step 375, the TOS code to allocate the required GPIO pins in order for multiple tests to be run concurrently is automatically generated. For example, if GPIO core 140 (see FIG. 3) has 15 pins, then a muxed core requiring 7 pins and a muxed core requiring up to 8 pins can be run together. Obviously, some muxed cores may require so many pins that they must be run alone.

In step 380, EMMTD switch 315 (see FIG. 3) is programmed to connect the GPIO core 140 (See FIG. 3) to the muxed models corresponding to the muxed cores of step 375 for which pins have been allocated in step 375. The TOS code for this programming step is automatically generated. TOS.

In step 385, GPIO core 140 (see FIG. 1) is programmed to connect the GPIO to the muxed cores for which pins have been allocated in step 375. The TOS code for this programming step is automatically generated. TOS.

In step 390, test case 260 (see FIG. 3) is programmed to run.

In step 395, EMMTD switch 315 (see FIG. 3) is programmed to disconnect the GPIO 140 (See FIG. 3) from the muxed models for which pins have been allocated in step 375. The TOS code for this programming step is automatically generated.

In step 400, GPIO core 140 (see FIG. 1) is programmed to disconnect the GPIO from the muxed cores for which pins have been allocated in step 375. The TOS code for this programming step is automatically generated.

In step 405, the TOS code to free the GPIO pins allocated in step 375 is automatically generated.

Implementation of the method illustrated in FIG. 4 and described above, requires a user to simply declare a GPIO pin allocation in the SDF file of the TOS as a resource for a specific test case. For example, if the core is connected to GPIO Alt1, bit 2 and the GPIO is connected to EMMTD Byte 3, bit 6, then the declaration is A connect GPIO alt1, bit 2 to EMMTD byte 3, bit 6. The TOS code is generated to allocate the pins and to setup the connection and subsequently release the connection following the test assuring concurrency of multiplexed test cases in a system verification environment.

Figure 5:
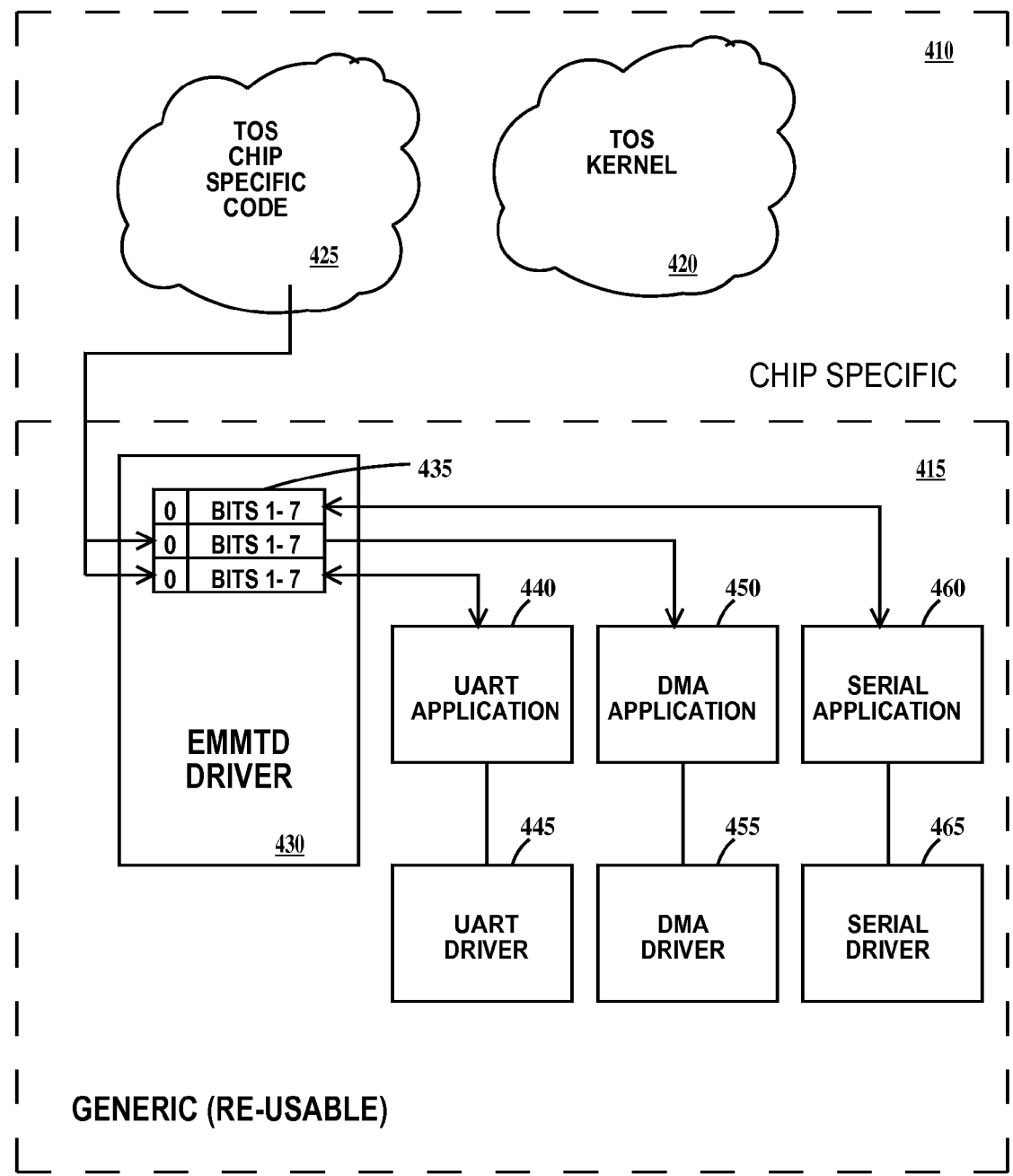
FIG. 5 is an exemplary software schematic representation illustrating switching control of the external muxed driver models illustrated in FIG. 3 according to the present invention.

FIG. 5 is an exemplary software schematic representation illustrating switching control of the external muxed driver models illustrated in FIG. 3 according to the present invention. In FIG. 5, running on embedded processor 105 (see FIG. 3) is chip specific code 410 and generic code 415. Chip specific code 410 includes a TOS kernel 420 and TOS chip specific code 425. Running on generic code 415 is an EMMTD driver 430 including an address map 435, a UART application 440 and a UART driver 445, a DMA application 450 and a DMA driver 455 and a serial application 460 and a serial driver 465. Address map 435 corresponds to address register 315 of FIG. 3. Chip specific code 425 writes bit 0 of address map 435 in order to set EMMTD switch 315 (see FIG. 3). UART application 440, DMA application 450 and serial application write bits 1 through 7 of address map 435 in order to control start/run/stop of muxed UART model 325, muxed DMA model 355 and muxed serial model 340 of FIG. 3 respectively.

Figure 6:
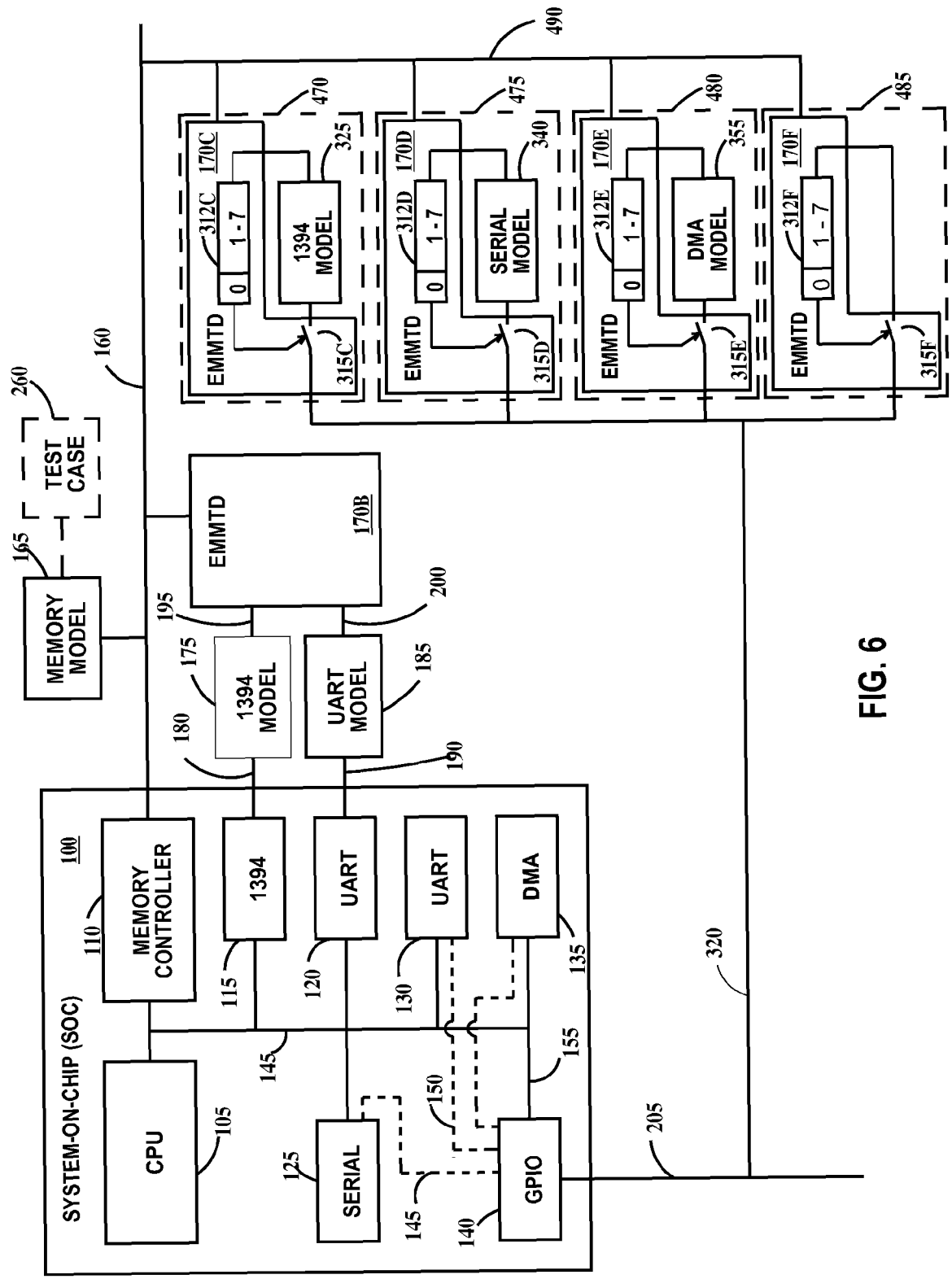
FIG. 6 illustrates an exemplary SOC that includes dedicated and muxed cores connected to external dedicated and muxed driver models and communicated with/controlled by an EMMTD in response to a test case according to a second embodiment of the present invention.

FIG. 6 illustrates an exemplary SOC that includes dedicated and muxed cores connected to external dedicated and muxed driver models and communicated with/controlled by an EMMTD in response to a test case according to a second embodiment of the present invention. FIG. 6 differs from FIG. 3 only in that the EMMTD function is distributed.

In FIG. 6, EMMTD 170B is coupled to dedicated 1394 model 175 and dedicated UART model 185. A first module 470 includes an EMMTD module 170C (comprising an address register 312C and an EMMTD switch 315C) and a muxed 1394 model 325 coupled between address register 312C and EMMTD switch 315C. A second module 475 includes an EMMTD module 170D (comprising an address register 312D and an EMMTD switch 315D) and a muxed serial 1394 model 340 coupled between address register 312D and EMMTD switch 315D. A third module 480 includes an EMMTD module 170E (comprising an address register 312E and an EMMTD switch 315E) and a muxed DMA model 355 coupled between address register 312E and EMMTD switch 315E. A fourth module 485 includes an EMMTD module 170F comprising an address register 312F and an EMMTD switch 315F. EMMTDs 170C, 170D, 170E and 170F are coupled to memory bus 160 by a bus 490. Depending upon pin allocation, one or more of EMMTD switches 315C, 315D, 315E and 315F may be programmed to connect corresponding J/O driver models to bus 320.

Figure 7:
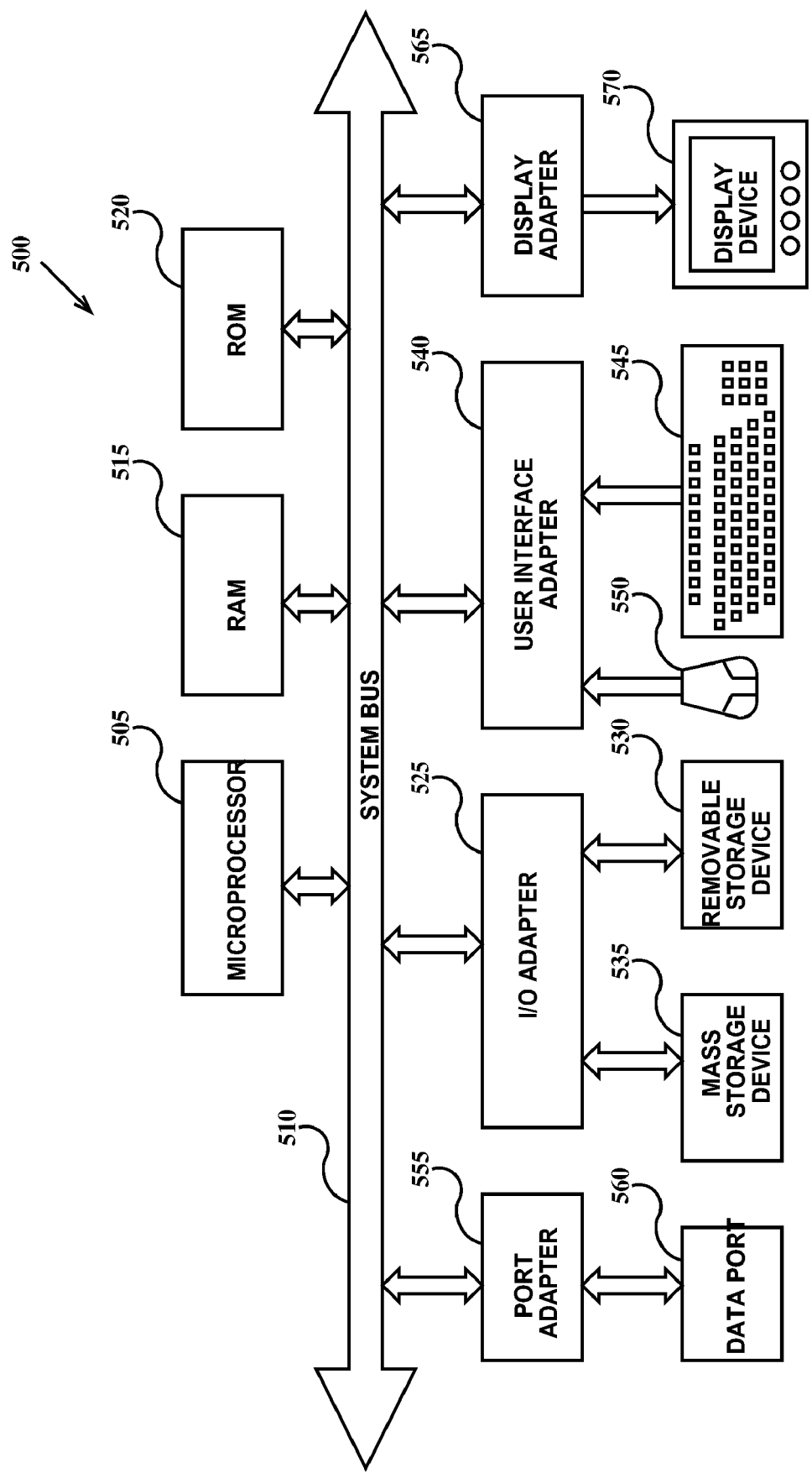
FIG. 7 is a schematic block diagram of a general-purpose computer for practicing the present invention.

Generally, the method described herein with respect to switching external models in an automated system-on-chip integrated circuit design verification system is practiced with a general-purpose computer and the method may be coded as a set of instructions on removable or hard media for use by the general-purpose computer. FIG. 7 is a schematic block diagram of a general-purpose computer for practicing the present invention. In FIG. 7, computer system 500 has at least one microprocessor or central processing unit (CPU) 505. CPU 505 is interconnected via a system bus 510 to a random access memory (RAM) 515, a read-only memory (ROM)

520, an input/output (I/O) adapter 525 for a connecting a removable data and/or program storage device 530 and a mass data and/or program storage device 535, a user interface adapter 540 for connecting a keyboard 545 and a mouse 550, a port adapter 555 for connecting a data port 560 and a display adapter 565 for connecting a display device 570.

ROM 520 contains the basic operating system for computer system 500. The operating system may alternatively reside in RAM 515 or elsewhere as is known in the art. Examples of removable data and/or program storage device 530 include magnetic media such as floppy drives and tape drives and optical media such as CD ROM drives. Examples of mass data and/or program storage device 535 include hard disk drives and non-volatile memory such as flash memory. In addition to keyboard 545 and mouse 550, other user input devices such as trackballs, writing tablets, pressure pads, microphones, light pens and position-sensing screen displays may be connected to user interface 540. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 530, fed through data port 560 or typed in using keyboard 545.

The present invention of a design verification system reduces the amount of chip specific design software required for verification of pin-muxing and makes the muxing of signals through a GPIO core transparent to setting up an SOC verification environment.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore it is intended that the following claims cover all such modifications and changes as fall within the true spirit and scope of the invention.

What is claimed is:

1. A method for verifying an integrated circuit design comprising:
providing a simulation model of an I/O controller connected to one or more simulated I/O cores, said simulated I/O cores part of said integrated circuit design;
providing a simulation model of an external memory mapped test device having a simulated switch for selectively connecting one or more of said simulated I/O cores to corresponding simulated one or more I/O driver models;
providing a simulated bus for transferring signals between said I/O controller and said switch;
storing a test case comprising computer-executable instructions on an external memory device;
providing a test operating system for controlling said switch;
simulating said integrated circuit design by running said test case on said test operating system; and
wherein said external memory mapped test device is a software module, said simulated I/O cores and said simulated I/O controller are software descriptions of said integrated circuit design and said external memory mapped test device, said simulated I/O cores and said simulated I/O controller and said test case are executable by said test operating system on an embedded processor to perform verification of said integrated circuit design.

2. The method of claim 1, further including:
distributing said external memory mapped test device and said switch among a plurality of simulated external memory mapped test device modules, each module containing a portion of said switch and connected to one of said one or more simulated I/O driver models.

3. The method of claim 1, further including:
providing said simulated external memory mapped test device with a simulated address register for setting said switch and controlling said one or more simulated I/O driver models.

4. The method of claim 1 further including:
providing a simulated embedded processor in said integrated circuit design for running said test operating system.

5. The method of claim 2, further including:
providing each external memory mapped test device module with a simulated address register for setting said portion of said switch and controlling said one or more I/O driver models.

6. The method of claim 2, further including:
providing each integrated circuit design with a simulated embedded processor for running said test operating system.

7. The method of claim 1, further including:
distributing said external memory mapped test device and said switch among a plurality of simulated external memory mapped test device modules, each module containing a portion of said switch and connected to one of said one or more I/O driver models; and
providing a simulated additional external memory mapped test device module directly connected to simulated one or more additional I/O driver models, each additional I/O driver model directly connected to a simulated additional I/O core, each additional I/O core part of said integrated circuit design.

8. A method, comprising:
loading code representing a computer simulation model of an integrated circuit design into a memory unit, said computer simulation model of said integrated circuit design including simulated I/O cores, a simulated memory controller, a simulated I/O controller, a simulated bus system and a simulated processor, said simulated I/O cores and said simulated I/O controller connected to said simulated processor by said simulated system bus;
loading into said memory unit, code representing (i) an external memory model connected to a simulated external memory mapped test device and to said simulated memory controller, (ii) one or more first external I/O driver models connected between said simulated I/O cores and said simulated external memory mapped test device and (iii) one or more second external I/O driver models connected between a simulated switch of said simulated external memory mapped test device and said simulated I/O controller, said simulated switch programmably connectable to said one or more second external I/O driver models in response to computer-executable instructions in a test case, all said connections of (i), (ii) and (iii) by corresponding simulated I/O buses;
loading said test case into said processor, said test case comprising said list of computer-executable instructions for said simulated processor into said external memory model, said instructions describing selection of one or more simulated I/O cores and corresponding second external I/O models, allocation of pins of said I/O controller to selected simulated I/O cores and switch positions of said simulated switch to connect said corresponding second external I/O models to said I/O controller;

executing said test case on said process and allocating and connecting I/O pins of said simulated I/O controller to one or more of said simulated I/O cores, and connecting said simulated external memory mapped test device to said simulated I/O controller through said corresponding second external I/O models executing test stimuli of said test case on said simulated processor in order to generate data representing a response of said computer simulation model of said integrated circuit design to said test case;

outputting said data representing (iv) a response of said computer simulation model of said integrated circuit design to said test case to a computer readable media or a computer, (v) displaying said data representing a response of said computer simulation model of said integrated circuit design on a computer screen, or both (iv) and (v).

9. The method of claim 8, wherein said simulated external memory mapped test device and said simulated switch are distributed among a plurality of simulated external memory mapped test device modules, each module of said plurality of simulated external memory mapped test device modules containing a portion of said simulated switch and connected to a respective second external I/O driver model of said second external I/O driver models.

10. The method of claim 9, wherein each said simulated external memory mapped test device module further includes a simulated address register.

11. The method of claim 9, wherein said simulated external memory mapped test device further includes a simulated address register.

12. The method of claim 9, wherein said simulated external memory mapped test device and said simulated switch are distributed among a plurality of simulated external memory mapped test device modules, each module of said plurality of simulated external memory mapped test device modules containing a portion of said simulated switch and connected to a respective second external I/O driver model of said one or more second external I/O driver models; and loading code representing an additional simulated external memory mapped test device module into said memory unit;

said loading of said test case connecting one or more additional second external I/O driver models to said additional simulated external memory mapped test device by additional simulated I/O buses; and said loading of said test case connecting each additional second external I/O driver model to a respective additional simulated I/O core by said simulated system bus, each additional simulated I/O core comprising said model of integrated circuit design.

13. The method of claim 9, wherein said one or more simulated I/O cores are each independently selected from the group consisting of a simulated 1394 I/O core, a simulated universal asynchronous receiver transmitter core, a simulated serial core, a simulated general purpose I/O core, and a direct memory access core.

* * * * *